(12) United States Patent
Kengeri

(10) Patent No.: US 6,442,098 B1
(45) Date of Patent: Aug. 27, 2002

(54) HIGH PERFORMANCE MULTI-BANK COMPACT SYNCHRONOUS DRAM ARCHITECTURE

(75) Inventor: Subramani Kengeri, Cupertino, CA (US)

(73) Assignee: Alliance Semiconductor, Santa Clara, CA (US)

( * ) Notice: Subject to any disclaimer, the term of this patent is extended or adjusted under 35 U.S.C. 154(b) by 0 days.

(21) Appl. No.: 09/778,382

(22) Filed: Feb. 6, 2001

Related U.S. Application Data

(60) Provisional application No. 60/181,072, filed on Feb. 8, 2000.

(51) Int. Cl.$^7$ ................................................. G11C 8/00
(52) U.S. Cl. ................................... 365/230.03; 365/233
(58) Field of Search ........................... 365/230.03, 233; 710/100; 711/5; 713/503

(56) References Cited

U.S. PATENT DOCUMENTS

| 6,122,688 | A  | * | 9/2000  | Barth et al. | 710/100 |
| 6,173,356 | B1 | * | 1/2001  | Rao | 711/5 |
| 6,226,757 | B1 | * | 5/2001  | Ware et al. | 713/503 |
| 6,310,817 | B1 | * | 10/2001 | Kablanian | 365/230.03 |

* cited by examiner

Primary Examiner—Trong Phan
(74) Attorney, Agent, or Firm—Beyer Weaver & Thomas LLP

(57) ABSTRACT

Apparatus, methods, and systems are disclosed for providing a memory device, such as a SDRAM, having distributed memory bank segments logically coupled to form a virtual memory bank. Each of the virtual memory banks has coupled to it an associated segmented sense amp which responds to an appropriate bank select signal by sensing data stored in a selected memory bank segment. The segmented sense amp uses a segmented bit line to reduce bit sense latency without decreasing bit density or increasing chip size.

11 Claims, 8 Drawing Sheets

HIGH PERFORMANCE MULTI-BANK COMPACT SYNCHRONOUS DRAM ARCHITECTURE

CROSS-REFERENCE TO A RELATED APPLICATION

This application claims benefit of priority under 35 U.S.C. 119(e) of (i) U.S. Provisional Application No. 60/181,072 filed Feb. 8, 2000 and entitled "High Performance Multi-band Compact Synchronous Dram Architecture" which is incorporated by reference in its entirety.

BACKGROUND OF THE INVENTION

1. Field of the Invention

The invention relates to semiconductors and more particularly to memory devices such as Synchronous Dynamic Random Access Memory devices.

2. Discussion of Related Art

Conventional Dynamic Random Access Memory (DRAM), of the type that has been used in PCs since the original IBM PC, is said to be asynchronous. This refers to the fact that the operation of the memory is not synchronized to the system clock but depends entirely on the timing inherent in the memory device regardless of the frequency of the system clock.

For example, referring to FIG. 1, a system 100 has a processor 101 that is coupled to a memory controller 104 by way of an address bus 106 and a bi-directional data bus 108. The memory controller 104 is, in turn, coupled to an asynchronous type memory device 110 by way of both the address bus 106 and the data bus 108. In order to access the memory device 110 in what is referred to as either a READ or a WRITE operation, a specific procedure must be followed. Typically, the processor 101 generates a specific memory address request (also referred to as a memory page request) corresponding to the location in the memory device 110 where data (or memory page) required by the processor 101 is stored. The memory address request is passed to the memory controller 104 by way of the address bus 106.

In conventional memory systems, the memory controller 104 generates the appropriate memory access signals that are decoded by the memory device 110 identifying the memory location in the memory device 110 where the requested data is stored. Once accessed, the stored data is output to the data bus 108 to be read by the processor 101 or whatever other device requested it. It should be noted that since the above-described operations are performed asynchronously with regard to the system clock, the processor 101 is usually required to wait for the appropriate data to be made available. These wait states degrade effective processor performance since the processor 101 cannot complete a desired operation without the requisite data from the memory device 110.

More specifically, during, for example, a READ operation, the processor 101 generates an address request corresponding to the memory location in the memory device 110 at which the required data is stored. Since all memory chips hold their contents in a logical "square" of memory cells 112 in the form of rows 114 and columns 116, reading data stored in, for example, the memory cell 112a, requires that first, a row 114a be activated using what is referred to as a "Row Address Select" (or "Row Address Strobe", "/RAS") signal that is provided by the memory controller 104. Specifically, the RAS is a signal sent to a DRAM that tells it that an associated address is a row address. Typically, the /RAS signal is based upon a "lower half" of the address request provided by the processor 101. When received and properly decoded, the /RAS signal causes the data in the entire row 114a to be transferred to a sense amp 118 after a period of time required for the selected row to stabilize.

Once the selected row has stabilized and the data in the selected row is transferred to the sense amp 118, the memory controller 104 further decodes the address request forming what is referred to as a "Column Address Select" ("/CAS") signal which when sent to a DRAM tells it that an associated address is a column address. The /CAS signal causes column select circuitry (not shown) to select the specific cell (in this case 112a) in the memory array that contains the desired data. The data stored in the cell 112a is then sent out to the data bus 108 from the sense amp 118 where the processor 101 or other device that requested the data can read it. It should be noted that the data bus 108 is a bi-directional data bus since during a WRITE operation, the processor 101 provides data to be stored in the memory device 110.

FIG. 2 is a timing diagram 200 illustrating the above-described READ operation. The performance of the memory device 110 is based upon several critical timing paths that includes the duration of time between the acquisition of data at the data bus 108 and the falling edge of the /RAS signal (referred to as access time from /RAS, or $t_{rac}$). Another critical timing path is referred to as access time to column address $t_{cac}$ is defined as the duration of time from the falling edge /CAS to the data out to data bus 110. Any, and all, of these delays, also referred to as memory latency, degrades system performance since the speed of the DRAM is directly related to the slowest critical path.

Usually, the worst case latency in any DRAM is specified by the row access time $t_{RAC}$ that is itself composed of several components, at least two of which are directly related to data line length (and therefore chip size and bit density) and the associated capacitive loading coupled thereto (referred to as RC delay). One such component is referred to as bit line sensing latency which is defined as the time for the data stored in a memory cell to be detected by the corresponding sense amp. This bit line sensing latency is affected by many factors, including bit line architecture, the RC of the sense amp drive line, cell-to-bit line capacitance ratio, as well as sense amp topology. Another component which substantially contributes to overall memory latency is referred to as output driving latency. Output driving latency is defined as the time required for the data to be propagated from the sense amp to the output node (again an RC-type delay).

Conventional attempts to reduce $t_{RAC}$ generally strive to reduce these two components by way of various circuit and layout techniques. In the case of bit line sensing latency, since the cell-to-bit line capacitance ratio directly impacts the bit line sensing delay, increasing this ratio reduces the bit line sensing latency (by providing a higher memory cell drive current). Typically, this approach is practiced by either increasing memory cell capacitance (by increasing cell size) or by putting fewer memory cells on a single bit line. Unfortunately, however, both of these approaches increase overall cell area which reduces cell density resulting in larger chips with lower bit density and a concomitant increase in cost.

Fortunately, even with these circuit delays, the asynchronous DRAM memory device 110 works well in lower speed memory bus systems, it is not nearly as suitable for use in high-speed (>66 MHz) memory systems since each READ operation and WRITE operation can not be any faster than the memory latency which is typically on the order of 5–7 clock cycles. In order to service these high-speed systems, therefore, a relatively new and different kind of RAM, referred to as Synchronous DRAM, or SDRAM, has been developed. The SDRAM differs from earlier types of DRAM in that it is tied to the system clock and therefore does not run asynchronously as do standard DRAMs. Since SDRAM is tied to the system clock and is designed to be able to READ or WRITE from memory in what is referred to as a burst mode (after the initial READ or WRITE latency) at 1 clock cycle per access (zero wait states), the SDRAM is able to operate at bus speeds up to 100 MHz or even higher. By running at the system clock, no wait states are typically required (after initial set up) by the processor resulting in the higher system speeds.

SDRAM accomplishes its faster access using a number of internal performance improvements that include a "burst mode" capability, which allows the SDRAM to transfer multiple cells without cycling the /CAS line thereby limiting the CAS latency to the first few clock cycles of the burst read. This operation is what makes SDRAM "faster" than conventional DRAM even though the actual internal operations are essentially the same. By way of example, a 4 cycle burst READ can be accomplished in 8 clock cycles (5,1,1,1) where "5" represents the initial READ latency of 5 clock cycles, whereas to read the same data, a standard DRAM would require 20 clock cycles (5,5,5,5). Another internal improvement is related to the organization of the SDRAM memory core. Using what is referred to as a multi-bank architecture, the memory cells that constitute the storage elements of the SDRAM are grouped in what is referred to as memory banks each of which is selected (or not) based upon a bank select signal. In this way, while one bank one of the multi-bank SDRAM is outputting data during a READ, for example, another bank is being activated such that there is effectively no latency in accessing any banks after initial startup.

Referring to FIG. 3 showing a prior art multi-bank SDRAM 300. The SDRAM 300 includes a number of memory banks, bank 0, bank 1, bank 2, and bank 3, each of which must be capable of supplying a full data word to each of the I/O's 302, 304, 306, and 308. In the case of, for example, a ×32 architecture, (i.e., the SDRAM 300 is coupled to a 32 bit data bus) each of the memory banks bank 0 through bank 3, when selected, must provide an 8 bit data word to each of the outputs 302–308, for example, during a READ operation, in order for a total of 32 bits to be transferred to at 32 bit data bus.

For example, the bank 0 has stored therein a requested 32 bit data word D the form of 8 bit data words $D_1$, $D_2$, $D_3$, and $D_4$. During an exemplary READ operation, a bank select signal activates the bank 0 and (after appropriately accessing the memory location at which the data word $D_1$ is stored), a sense amp 310 coupled to the bank 0 outputs the data word $D_1$ to the output 302 by way of a data line 312. In a similar manner, after appropriate decoding, the sense amp 310 outputs the data word $D_2$ to the output 304 by way of a data line 314, the data word $D_3$ to the output 306 by way of the data line 316, and the data word $D_4$ by way of the data line 318 to the output 308. In all cases, the period of time between the output of the data word $D_i$ from the sense amp 310 and its receipt at the corresponding output is referred to as output drive delay time $t_i$. For example, the time it takes the data word $D_3$ to travel from the sense amp 310 to the output 308 is referred to as the output drive delay time $t_3$.

Since each of the output drive delay times $t_i$ are directly dependent on line length, it is important that the line lengths of the data lines 312–318 be as short as possible. For example, the output drive delay time $t_4$ will be substantially greater than the output drive delay time $t_1$ simply due to the fact that the length of the data line 318 is substantially greater than that of the data line 312. Since the overall performance of the SDRAM 300 is dictated by the slowest critical path, the longest data line will effectively dictate the overall speed performance of the SDRAM 300. Additionally, the skew between the various outputs 302–308 will be also directly related to the relative output drive delay times $t_i$.

Therefore, what is required is a compact, memory architecture suitable for providing high-speed memory access.

SUMMARY OF THE INVENTION

According to the present invention, methods, apparatus, and systems are disclosed for providing a high performance multi-bank synchronous dynamic random access memory. In one aspect of the invention, a memory device is described having a plurality of input/outputs (I/Os) coupled to a memory core having a plurality of input/outputs (I/Os). The memory core includes a plurality of memory cells coupled to the plurality of I/Os arranged to store data in the form of at least a first data word and a second data word. The memory core also includes a first bank segment arranged to store a first portion of the first data word, a second bank segment arranged to store a first portion of the second data word. The first bank segment and the second bank segment are logically separate and distinct such that the first bank segment is activated only in response to a first bank select signal and wherein the second bank segment is activated only in response to a second bank select signal.

The memory core also includes a first segmented sense amp coupled to the first bank segment by way of a first bit line and to the second bank segment by way of a second bit line, wherein the first bit line is shorter than the second bit line, and wherein the segmented sense amp responds to the first bank select signal by sensing the first portion of the data word using the first bit line and responds to a second bank select signal by sensing the first portion of the second data word using the second bit line such that a first bit line sensing delay associated with the first bit line is less than a second bit line sensing delay associated with the second bit line, and a first data line coupling the segmented sense amp to a nearest located one of the plurality of I/Os.

In one embodiment, a computing system is disclosed. The computing system includes a memory device having distributed memory bank segments coupled to associated segmented sense amps. The segmented sense amps provide reduced bit line sensing delays due to shortened bit lines corresponding to each of the bank segments. The computing system also includes a processor for performing executable instructions stored in the memory device coupled to a memory controller by way of a bi-directional data bus and an address bus.

In another embodiment, a method of accessing requested data from a memory device having a first bank segment and a second bank segment each of which are proximally located from their associated I/Os is provided. As a method a memory address request based upon requested data is generated. A first bank select signal is provided to the memory device based upon the memory address request. In response to the bank select signal, the segmented sense amp is enabled to sense the first portion of the data word while in response to a second bank select signal, the segmented sense amp is enabled to sense the second portion of the data word. The first portion of the data word is sensed from a memory cell in the first bank segment such that a first bit line sensing delay is commensurably reduced.

BRIEF DESCRIPTION OF THE DRAWINGS

The invention will be better understood by reference to the following description taken in conjunction with the accompanying drawings in which.

DETAILED DESCRIPTION OF THE PREFERRED EMBODIMENTS

Figure 1:
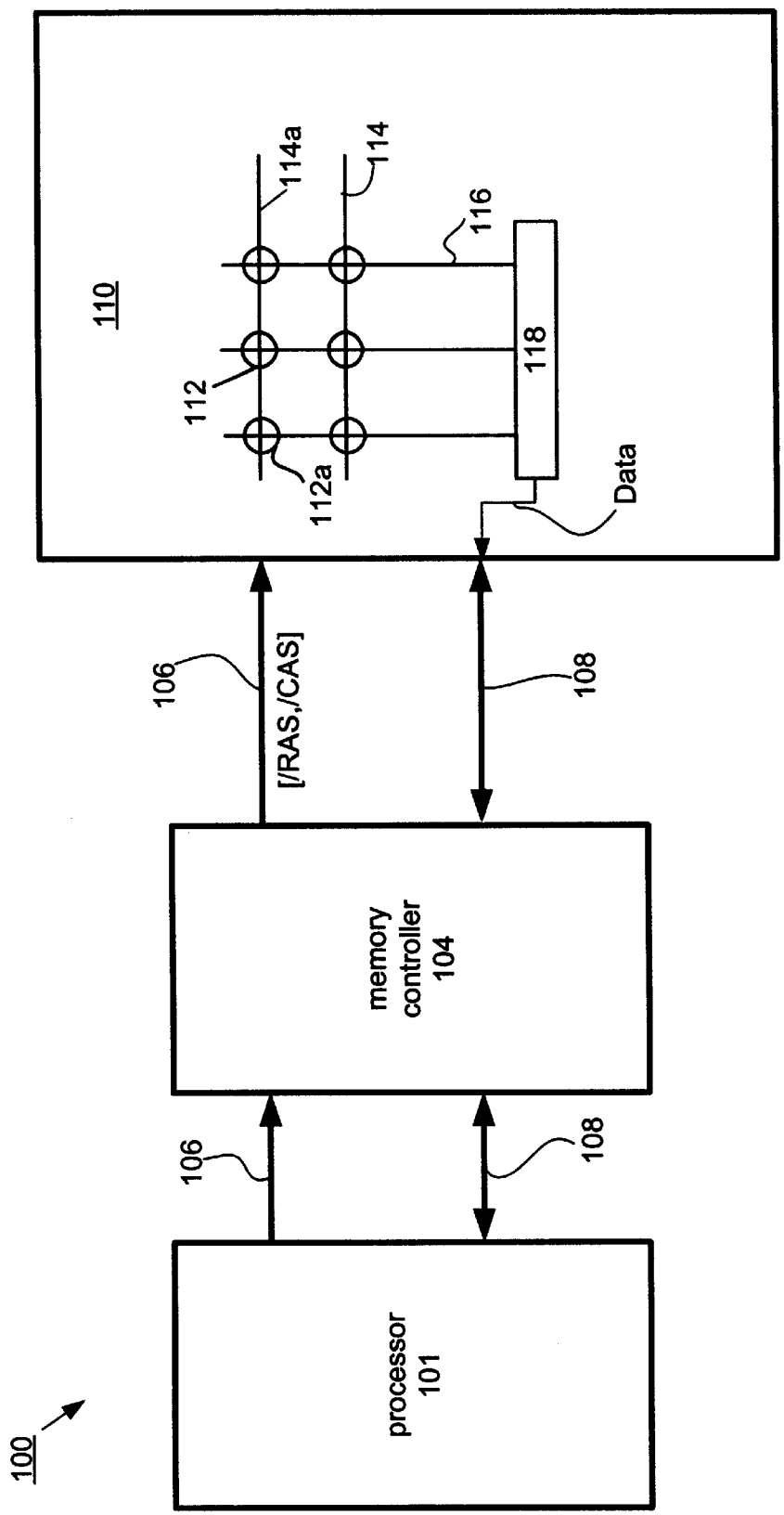
FIG. 1 is a block diagram of a conventional memory system that includes a prior art memory device.
Figure 2:
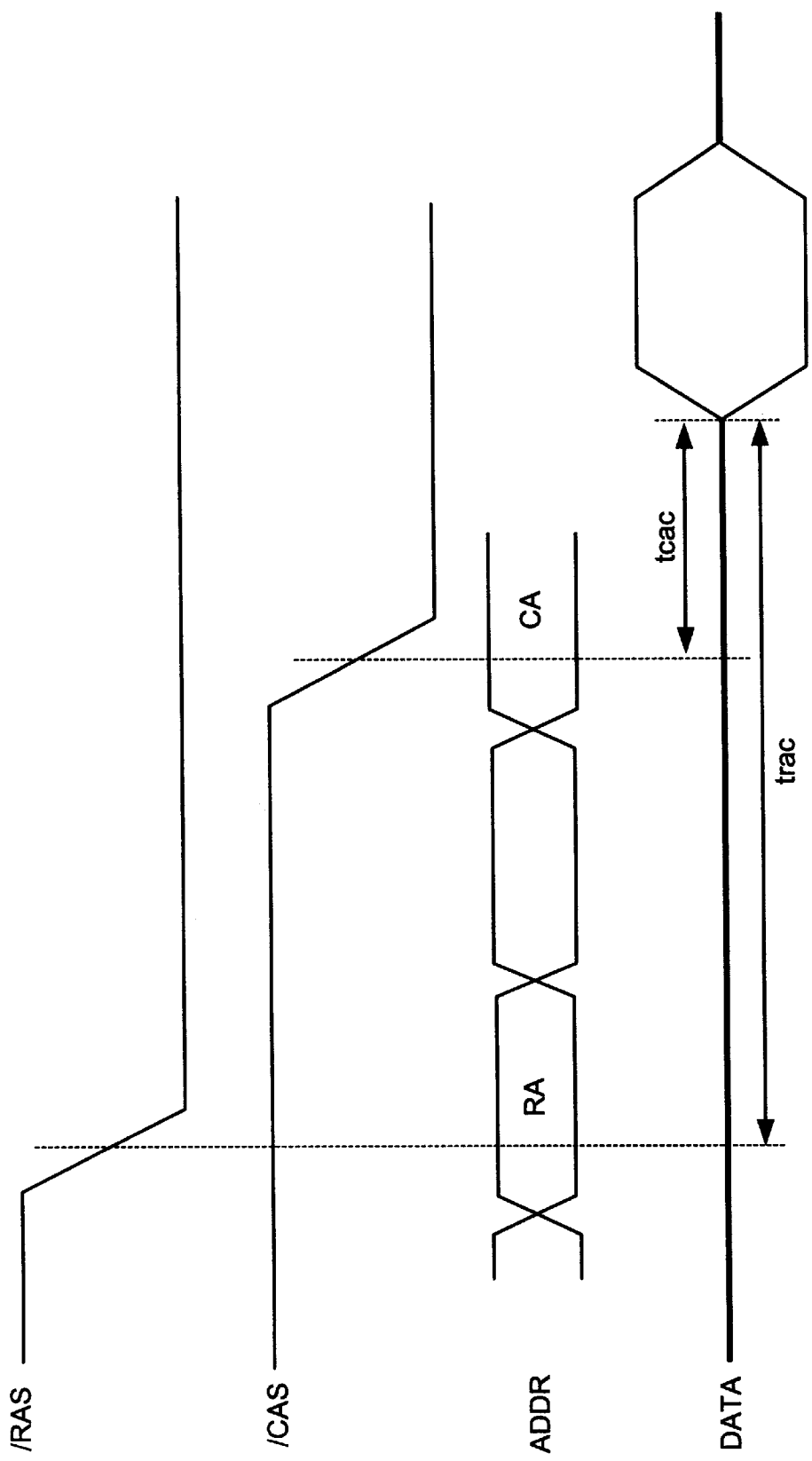
FIG. 2 is a typical timing diagram associated with the prior art memory device shown in FIG. 1 in the form of a conventional DRAM.
Figure 3:
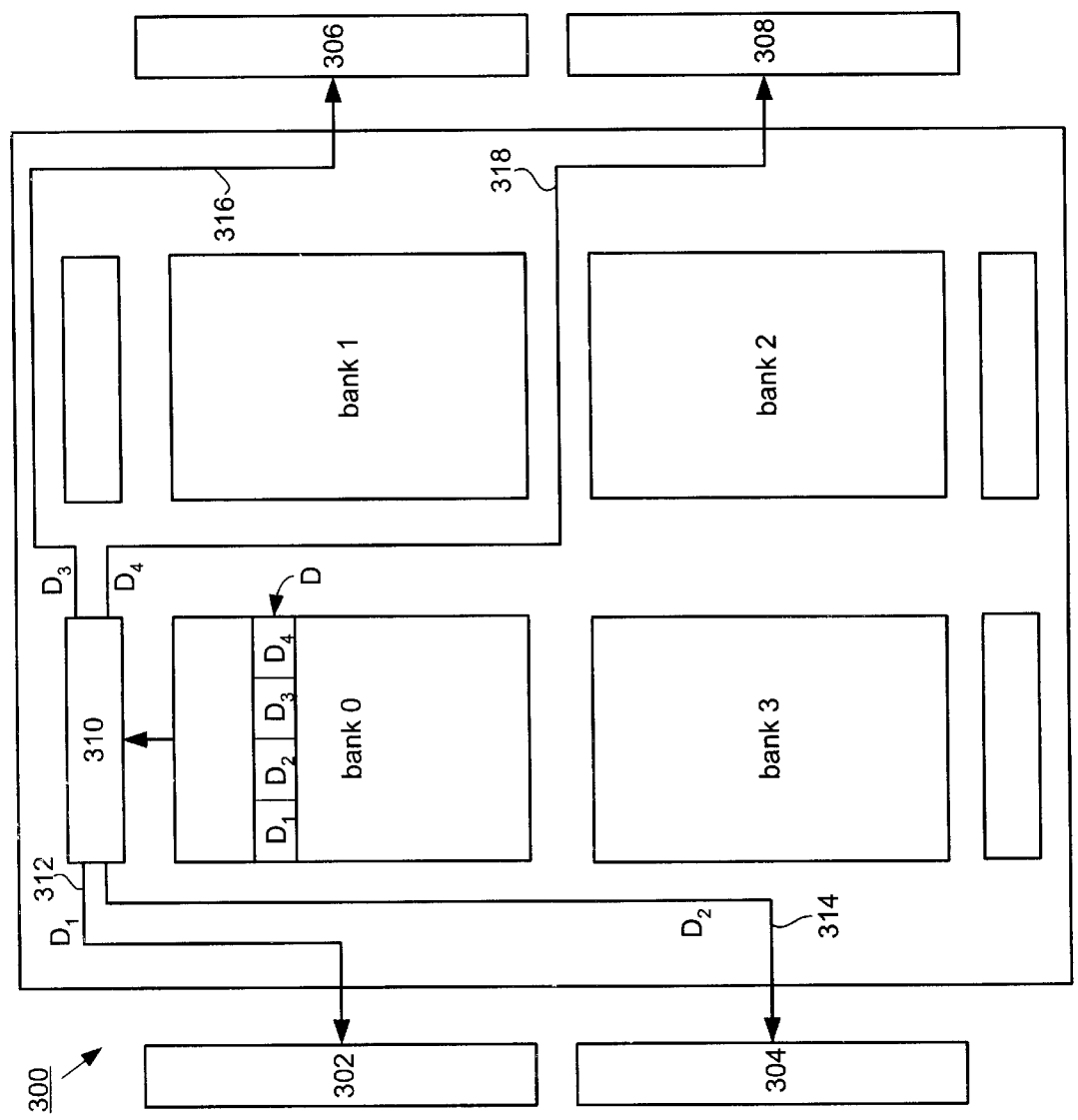
FIG. 3 is a prior art multi-banked SDRAM.

Reference will now be made in detail to a preferred embodiment of the invention. An example of the preferred embodiment is illustrated in the accompanying drawings. While the invention will be described in conjunction with a preferred embodiment, it will be understood that it is not intended to limit the invention to one preferred embodiment. To the contrary, it is intended to cover alternatives, modifications, and equivalents as may be included within the spirit and scope of the invention as defined by the appended claims. Synchronous DRAM (SDRAM) is rapidly becoming the new memory standard for modem PCs and other high speed memory systems. The reason is that its synchronized design permits support for the much higher bus speeds that have started to enter the market. As 100 MHz bus systems, such as PCs, become mainstream, SDRAM will largely replace older technologies, such as EDO RAM, since it is designed to work at these higher operating speeds whereas conventional asynchronous DRAM is not.

However, as currently configured, although fast, multi-banked SDRAM architectures introduce unnecessary signal delays that degrade overall system performance due to in part to the unoptimized placement of the various memory banks in relation to the device's outputs. For example, since each bank in a multi-bank system must be capable of supplying a full data word to all outputs (i.e., in a 32 bit system, a single bank must provide at least 32 bits to all outputs coupled to the 32 bit data bus), the signal delay from one memory bank located a greater distance from a particular output will be substantially greater than that from a memory bank that is proximally positioned to the same output.

In addition to the longer delay times, resulting in longer memory access times, signal skew between the various outputs serviced by memory banks located at differing distances from the various outputs requires additional logic in the form of latches in order to prevent race conditions (CORRECT?). In some cases, if complex enough, the additional logic has the potential to substantially degrade overall system performance in addition to adding to chip complexity with the increased potential for yield loss.

Broadly speaking, the invention describes a distributed memory architecture useful in fabricating high speed memory devices, such as SDRAMS, for operation in high speed systems, such as personal computers, high speed routers, (PLEASE LIST ANY OTHER APPLICATIONS) and the like. By distributing segmented sense amps throughout the memory core, each memory bank segment can be placed in proximate position to nearest associated one of the memory device's output nodes so as to substantially reduce output drive signal delay times. By segmenting the associated sense amp by, in a preferred embodiment, selectively using reduced capacitive bit lines, bit sense delay is substantially reduced. By logically coupling selected memory bank segments so as to be responsive to a particular bank select signal, a virtual memory bank is formed arranged to store a selected data word formed of data word segments stored in the respective bank segments. When a bank select signal is received, only those bank segments responsive to the received bank select signal are activated.

In a preferred embodiment, each of the logically coupled memory bank segments is arranged to store a corresponding portion of the stored data word, which when selected and activated, outputs the stored portion to an associated nearest output node proximally positioned thereto. In this way, the signal delays experienced by each of the memory bank segments during, for example, a READ operation is substantially reduced due, in part, to the reduced data path over which the data signals must pass.

In addition to the reduced signal delays, the signal skew between the various outputs are substantially eliminated since the differences in data paths between the various memory bank segments and the respective outputs are effectively eliminated.

In a preferred embodiment, by asymmetrically aligning selected ones of the distributed memory bank segments, when a particular virtual memory bank (being formed of constituent memory bank segments) is activated, power distribution throughout the memory device is rendered substantially uniform over the active memory core area since the activated virtual memory bank is not localized to a particular region of the memory core.

Figure 4:
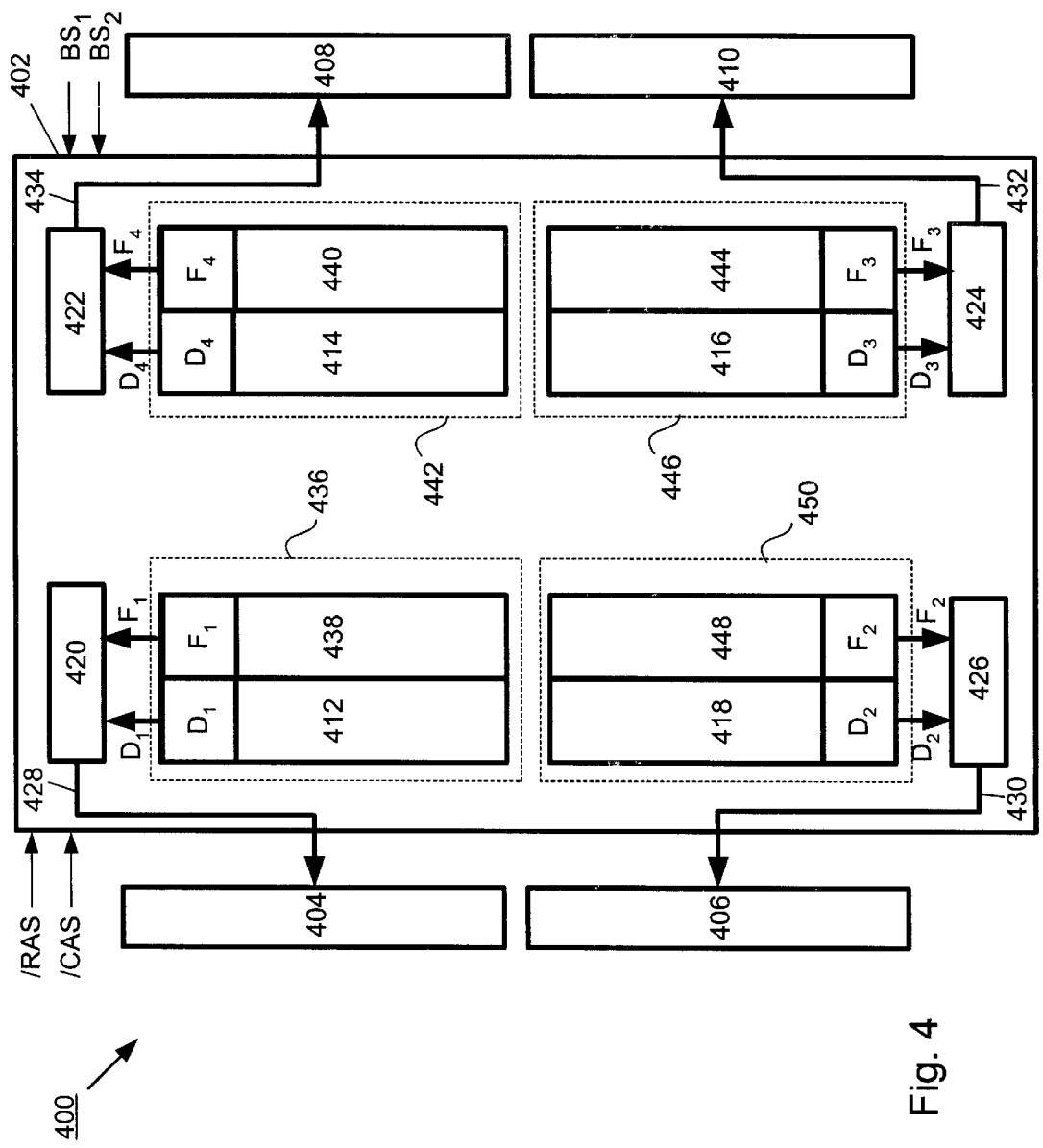
FIG. 4 is a distributed bank SDRAM in accordance with an embodiment of the invention.

Referring now to FIG. 4, a memory device 400 having a distributed memory bank architecture in accordance with an embodiment of the invention is presented. In the described embodiment, the memory device 400 takes the form of a SDRAM but it should be noted that the described architecture can be applied to any type memory device. Accordingly, the SDRAM 400 includes a memory core 402 arranged to respond to incoming input signals supplied by, for example, a processor, by providing appropriate data stored in pre-selected memory locations within the core 402. Input/output (I/O) 404 through 410 are coupled to external circuitry (not shown) and act as conduits for incoming address select and data input signals as well as data output signals. Typically, the data input signals are provided during what is referred to as a WRITE operation wherein the input data is stored at selected locations within the memory core 402.

In the described embodiment, the memory core 402 includes distributed bank segments 412–418 logically coupled to form a virtual memory bank suitably disposed to store a fill data word. By full data word, it is meant a data word of sufficient length as is required by a requesting device. For example, if the requesting device is a 32 bit processor coupled to the memory core 402 by way of a 32 bit data bus, then each of the distributed bank segments 412–418 is arranged to store an 8 bit portion of the 32 bit data word required by the requesting device.

By way of example, in order for the 32 bit processor to retrieve a 32 bit data word D (also referred to as a memory page), the 32 bit processor generates a memory page read request which is decoded by a memory controller (not shown) into appropriate /RAS and /CAS signals. In a preferred embodiment, the memory controller also provides an appropriate Bank Select signal BS which has the effect of activating only the bank segments 412–418 in which the various constituent portions, $D_1$, $D_2$, $D_3$, and $D_4$, of the requested memory page D are respectively stored. In the described embodiment, sense amps 420–426, respectively coupled to the distributed bank segments 412–418, are arranged to read the respective portions $D_1$, $D_2$, $D_3$, and $D_4$, of the requested memory page D. By way of example, the memory page portion $D_1$ is stored in the bank segment 412 at a row location defined by the received IRAS signal and selected by the sense amp 420 based upon the /CAS signal.

Once read, the portion $D_1$ is passed to the I/O 404 by way of a data line 428 that connects the sense amp 420 to the I/O 404. In a similar manner, the sense amp 426 reads the portion $D_2$ and passes it to the I/O 406 by way of a data line 430 that connects the sense amp 426 to the I/O 406, while the sense amp 424 reads the portion $D_3$ and passes it to the I/O 410 by way of a data line 432 that connects the sense amp 424 to the I/O 410. Likewise, the sense amp 422 reads the portion $D_4$ and passes it to the I/O 408 by way of a data line 434 that connects the sense amp 422 to the I/O 408.

It is important to note that since each of the bank segments 412–418 are in substantially equal close proximity to their respective I/O, the data lines 428–434 are of substantially equal lengths. In this way, the delay times associated with each of the data lines 428–434 are substantially equal to each other thereby effectively eliminating problems related to I/O skew.

In addition to the equality of the delay times, by distributing the bank segments 412–418 in such a way as to substantially reduce the lengths of the various data lines, the performance of the memory core 402 is enhanced since the critical timing paths represented by the data lines 428–434 are also reduced.

In a preferred embodiment, the memory core 402 includes a cluster of bank segments 436. The cluster of bank segments 436 includes a bank segment 438 that although in close physical proximity to the bank segment 412, it is nonetheless logically separate and distinct from the bank segment 412. By logically separate and distinct, it is meant that the bank segment 438 is not responsive to the bank select signal $BS_1$ for which the virtual bank formed of the bank segments 412–418 responds. This allows the bank segment 438 to be "precharging" (RAS and CAS activation) while the bank segment 412 is transferring data, and vice versa. Essentially, this substantially eliminates the latency for all accesses after the first one.

By logically coupling the bank segment 438 to other bank segments such as bank segment 440 in a cluster 442, a bank segment 444 in a cluster 446, and a bank segment 448 in a cluster 450, a second virtual memory bank composed of the logically coupled bank segments 438, 440, 444, and 448 can be formed responsive to a second bank select signal $BS_2$. In this way, the memory core 402 can be configured to transfer the data word D from a first virtual memory bank formed of the bank segments 412–418 in response to the first bank select signal $BS_1$ while precharging the second virtual memory bank in preparation for transferring a second data word stored in the bank segments 438, 440, 444, and 448 upon the receipt of a second bank select signal $BS_2$.

For example, when the bank segments 412–418 have completed transferring their respective portions $D_1$, $D_2$, $D_3$, and $D_4$, of the requested memory page D to the I/Os 404–410, the bank segments 438, 440, 444, and 448 have already been pre-charged and are immediately ready to respectively transfer data word portions $F_1$, $F_2$, $F_3$, and $F_4$ corresponding to a data word F (assuming, of course, that the appropriate /RAS and /CAS signals have been received).

Figure 5:
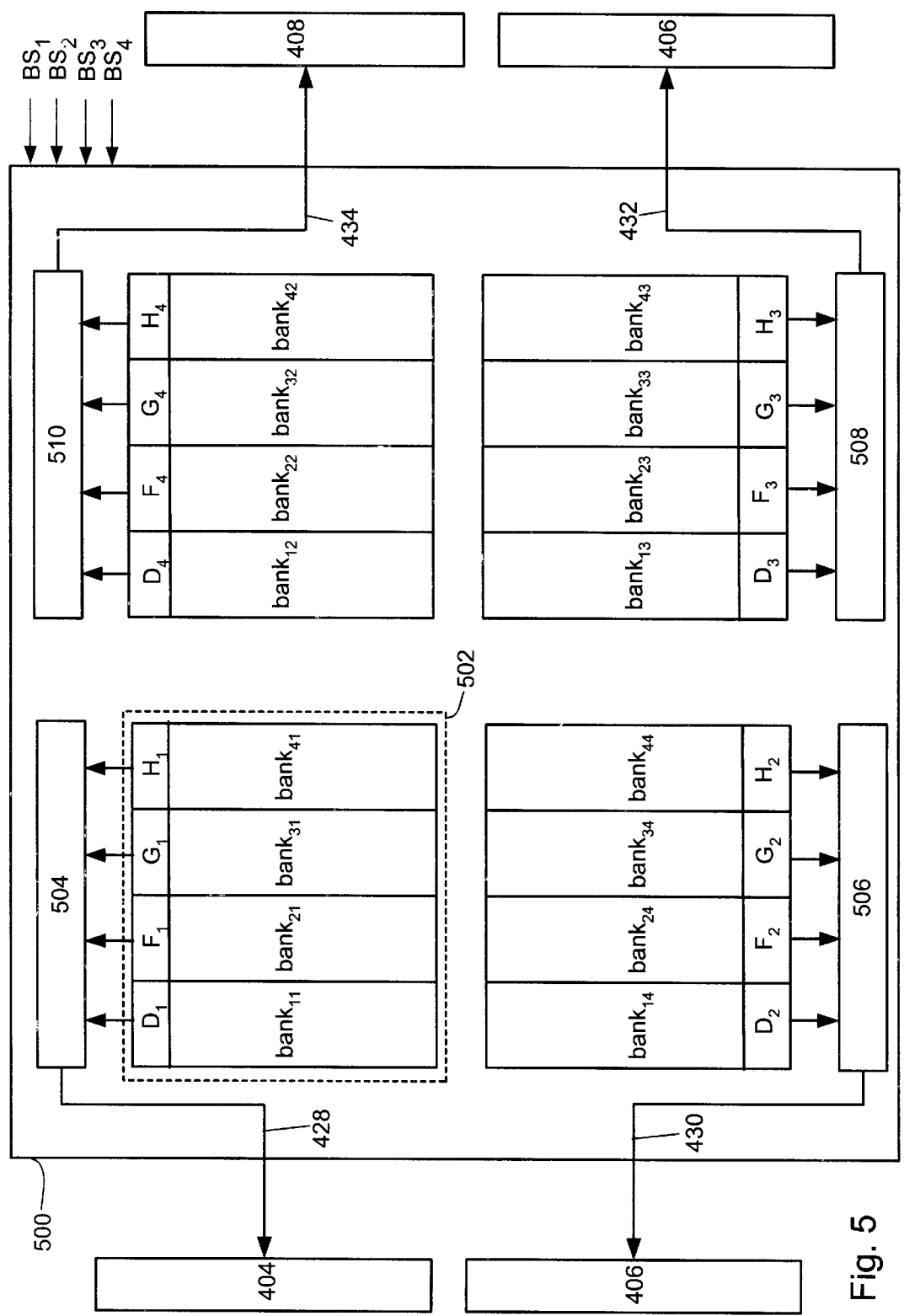
FIG. 5 shows an interleaved memory core having distributed memory bank segments in accordance with an embodiment of the invention.

It is one of the advantages of the invention that any number of virtual memory banks formed of constituent bank segments (each proximally positioned relative to an associated output) can be configured within the memory core 402 in order to create, for example, a high speed interleaved type memory device. For example, referring to FIG. 5, an interleaved memory core 500 having memory bank segments each being proximally positioned to an associated output in accordance with an embodiment of the invention is shown. It should be noted that the interleaved memory core 500 is but one implementation of the memory core 402. In the described embodiment, the memory core 500 includes M virtual memory banks each having N logically coupled bank segments each represented as $bank_{mn}$. For example, a first memory cluster 502 includes bank segments $bank_{11}$, $bank_{21}$, $bank_{31}$, and $bank_{41}$ each of which is coupled to a sense amp 504. Since each of the bank segments $bank_{11}$, $bank_{21}$, $bank_{31}$, and $bank_{41}$ are identified as belonging to virtual memory banks 1–4, respectively, each are responsive to different bank select signals, $BS_1$, $BS_2$, $BS_3$, and $BS_4$. In this way, the bank segment $bank_{11}$ can transfer data in response to the bank select signal $BS_1$ while the bank segment $bank_{21}$ (belonging to the virtual memory 2) is pre-charging in response to appropriate /RAS and /CAS signals. It should also be noted that each of the bank segments that form a particular virtual memory are in substantially equal close proximity to their respective I/O.

By interleaving the bank segments included within the various virtual memory banks and placing them substantially equal close proximity to their respective I/O, the performance of the memory core 500 can be substantially enhanced. For example, in one mode of operation, referred to as a burst mode of operation, consecutive data words of memory are read one after the other. The great advantage is that most of the overhead of the first access doesn't have to be repeated for the other three. So instead of those taking 5 to 7 clock cycles, they take only 1 to 3 clock cycles.

When reading or writing four data words, for example, the timing of burst mode access is generally stated using this type of shorthand: "x-y-y-y". The first number ("x") represents the number of clock cycles to do the first READ/WRITE. The other numbers are how many clock cycles to do the second, third and fourth READ/WRITEs. An example would be "5-2-2-2", which means 11 clock cycles to do the whole burst. (Without burst mode this access would take at least 20 clock cycles: "5-5-5-5").

For example, using the memory core 500 in a burst read mode the data words D, F, G, and H each being respectively stored in virtual memories 1, 2, 3, and 4 can be read using an access timing of, for example, 5,1,1,1 (total of 11 clock cycles). For example, during the time that the bank segments $bank_{11}$, $bank_{12}$, $bank_{13}$, and $bank_{14}$ in the virtual memory 1 are transferring their respective data word portions $D_1$, $D_2$, $D_3$, and $D_4$ to the sense amps 504, 506, 508, and 510, respectively, in response to the bank select signal $BS_1$, the bank segments $bank_{21}$, $bank_{22}$, $bank_{23}$, and $bank_{24}$ (that form the virtual memory bank 2) are precharging in preparation for transferring their respective data word portions $F_1$, $F_2$, $F_3$, and $F_4$ corresponding to a data word F in response to the bank select signal $BS_2$. The data words G and H can be transferred in similar manner by interleaving the transferring of data and pre-charging.

In addition to efficiently reading and writing data into and out of the memory device, the inventive distributed multi-bank architecture lends itself to reducing power spikes during the activation of the various memory banks. By distributing the bank segments that constitute the various virtual memories included in the memory core in such a way that no localization of power occurs (as does the conventional localized architectures) the probability of power spiking is substantially reduced.

In some cases it may be desirable to place certain bank segments of a virtual memory bank closer to a central portion of the memory core in order to more evenly distribute dissipated power. By more evenly distributing power, the possibility of localized power spikes and resulting localized heat build up is substantially reduced. For example, referring to FIG. 6, a memory core 600 having selected bank segments of a virtual memory centrally located in accordance with an embodiment of the invention is shown. In this way, when for example the virtual memory bank 1 formed of the bank segments is activated, the power spread more evenly over the entire area of the memory core 600.

As discussed above, bit line sensing latency is another substantial component in overall memory latency due primarily to the capacitive loading of bit lines due to the fact that they each typically extend the entire active length of each of the bank segments. In some embodiments, by segmenting the sense amps in such a way as to substantially reduce the length of a bit line associated with a particular sense amp, the corresponding capacitance perceived by that sense amp is concomitantly reduced. By reducing the bit line capacitance, the memory cell-to-bit line capacitance ratio is increased without resorting to techniques, such as increasing the size of each memory cell or decreasing the number of memory cells coupled to a particular bit line, for example, that substantially increase chip area and chip cost.

Figure 6:
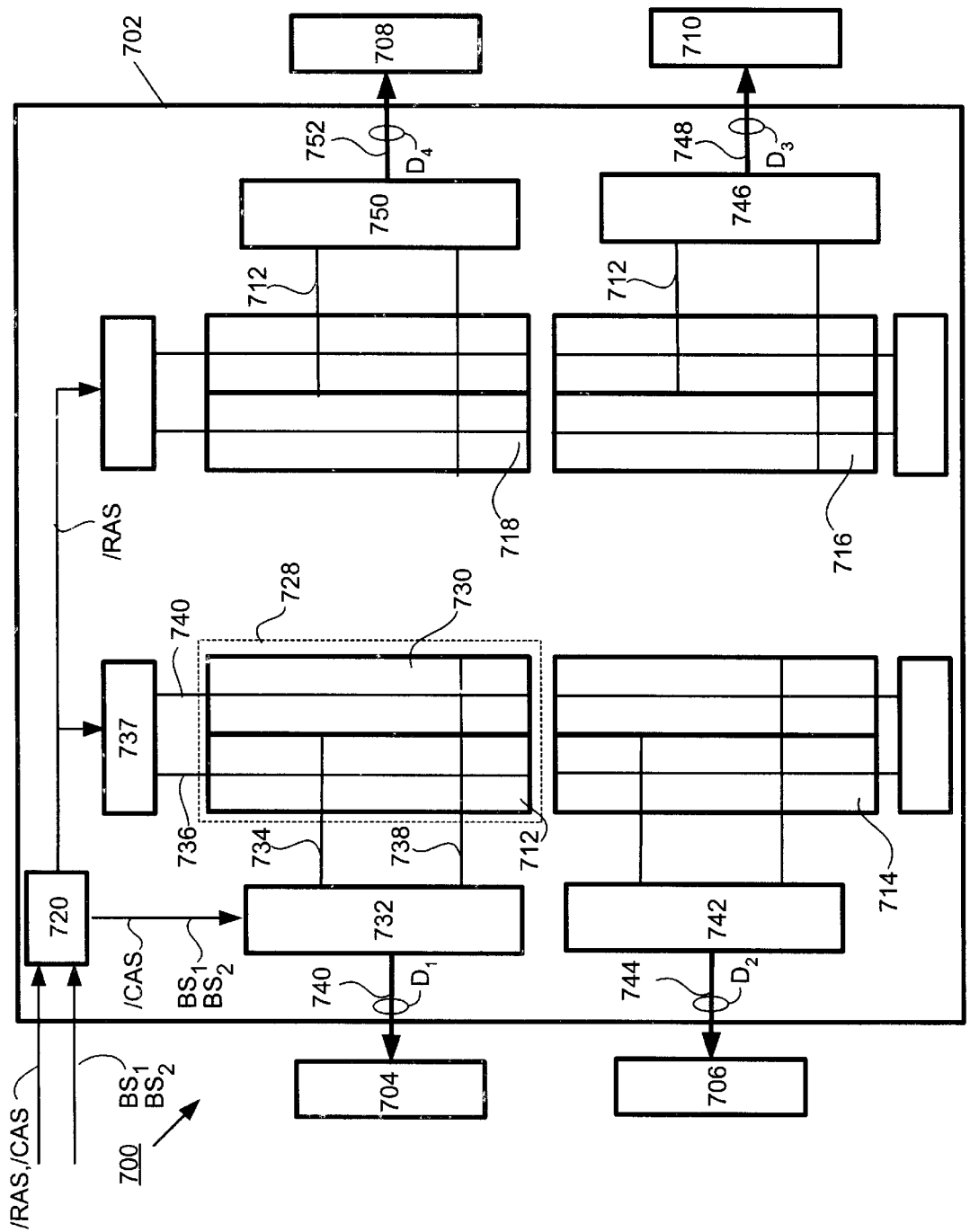
FIG. 6 illustrating a memory core having selected bank segments located in a central position of the memory core in accordance with an embodiment of the invention.

One such embodiment is shown in FIG. 6 illustrating a memory device 700 having a segmented sense amp architecture in accordance with an embodiment of the invention. In the described embodiment, the memory device 400 takes the form of a SDRAM but it should be noted that the described architecture can be applied to any type memory device. Accordingly, the SDRAM 700 includes a memory core 702 arranged to respond to incoming input signals supplied by, for example, a processor, by providing appropriate data stored in pre-selected memory locations within the core 702. Input/output (I/O) 704 through 710 are coupled to external circuitry (not shown) and act as conduits for incoming address select and data input signals as well as data output signals. Typically, the data input signals are provided during what is referred to as WRITE operation wherein the input data is stored at selected locations within the memory core 702.

In the described embodiment, the memory core 702 includes distributed bank segments 712–718 logically coupled to form a virtual memory bank suitably disposed to store a full data word. In a preferred embodiment, the memory core 702 includes a cluster of bank segments 728 that also includes a bank segment 730 that although in close physical proximity to the bank segment 712, is nonetheless logically separate and distinct from the bank segment 712. By logically separate and distinct, it is meant that the bank segment 730 responds to a bank select signal $BS_2$ and not to a bank select signal $BS_1$ to which the virtual bank formed of the bank segments 712–718 responds. This allows the bank segment 730 to be "precharging" (RAS and CAS activation) while the bank segment 712 is transferring data, and vice versa.

In the described embodiment, each of the cluster of bank segments has associated with it a segmented sense amp that uses shortened bit lines to selectively couple to associated ones of the constituent bank segments to sense data stored therein. In this way, the overall bit line sensing latency of the memory core 702 is substantially reduced without decreasing bit density. For example, a segmented sense amp 732 responds to the bank select signal $BS_1$ by using a shortened bit line 734 to sense data stored on those memory cells coupled to a wordline 736 identified by a wordline decoder 737 based upon the corresponding /RAS signal. Since the bit line 734 is substantially shortened in comparison to those found in conventional SDRAM architectures, the overall capacitance associated with the bit line 734 is commensurably reduced. By reducing the bit line capacitance, the memory cell-to-bit line drive ratio is increased without resorting to increasing the size of the associated memory cells thus preserving high bit density.

However, in response to the second bank select signal $BS_2$, the segmented sense amp 732 uses a bit line 738 to sense data stored in those memory cells coupled to a word line 740 identified by the wordline decoder 737 included in the bank segment 730. In this way, the segmented sense amp 732 responds to a received bank select signal by using only those bit lines associated with the selected bank segment such that the overall bit line sensing latency of the core 702 is substantially reduced.

During processor operation, for example, in order for a processor (not shown) to retrieve a 32 bit data word D (also referred to as a memory page) having portions $D_1$, $D_2$, $D_3$, and $D_4$ respectively stored in the bank segments 712–718. The processor generates a memory page read request which is decoded into appropriate /RAS, and /CAS, signals that are received by a multiplexer 720. In a preferred embodiment, the bank select signal $BS_1$ has the effect of activating only the bank segments 712–718 in which the various constituent data word portions, $D_1$, $D_2$, $D_3$, and $D_4$, of the requested memory page D are respectively stored. For example, in the described embodiment, the memory page portion $D_1$ is stored in the bank segment 712 on a wordline defined by the received /RAS signal. The segmented sense amp 732 uses the bank select signal $BS_1$ and the corresponding /CAS signal to sense the memory page portion $D_1$ by way of the bit line 734. The data word portion $D_1$ is then passed to the I/O 704 by way of a data line 740.

In a similar manner, a sense amp 742 reads the portion $D_2$ and passes it to the I/O 706 by way of a data line 744 that connects the sense amp 742 to the I/O 706, while a sense amp 746 reads the portion $D_3$ and passes it to the I/O 710 by way of a data line 748 that connects the sense amp 746 to the I/O 710. Likewise, the sense amp 750 reads the portion $D_4$ and passes it to the I/O 708 by way of a data line 752 that connects the sense amp 750 to the I/O 708.

It is important to note that since each of the bank segments 712–718 are in substantially equal close proximity to their respective I/O, the data lines 740, 744, 748, and 752 are of substantially equal lengths. In this way, the delay times associated with each of these data lines are substantially equal to each other thereby effectively eliminating problems related to I/O skew.

In addition to the equality of the delay times, by distributing the bank segments 712–718 in such a way as to substantially reduce the lengths of the various data lines, the performance of the memory core 702 is further enhanced since the output drive latency related to the lengths of the data lines 740, 744, 748, and 752 are also reduced.

Figure 7:
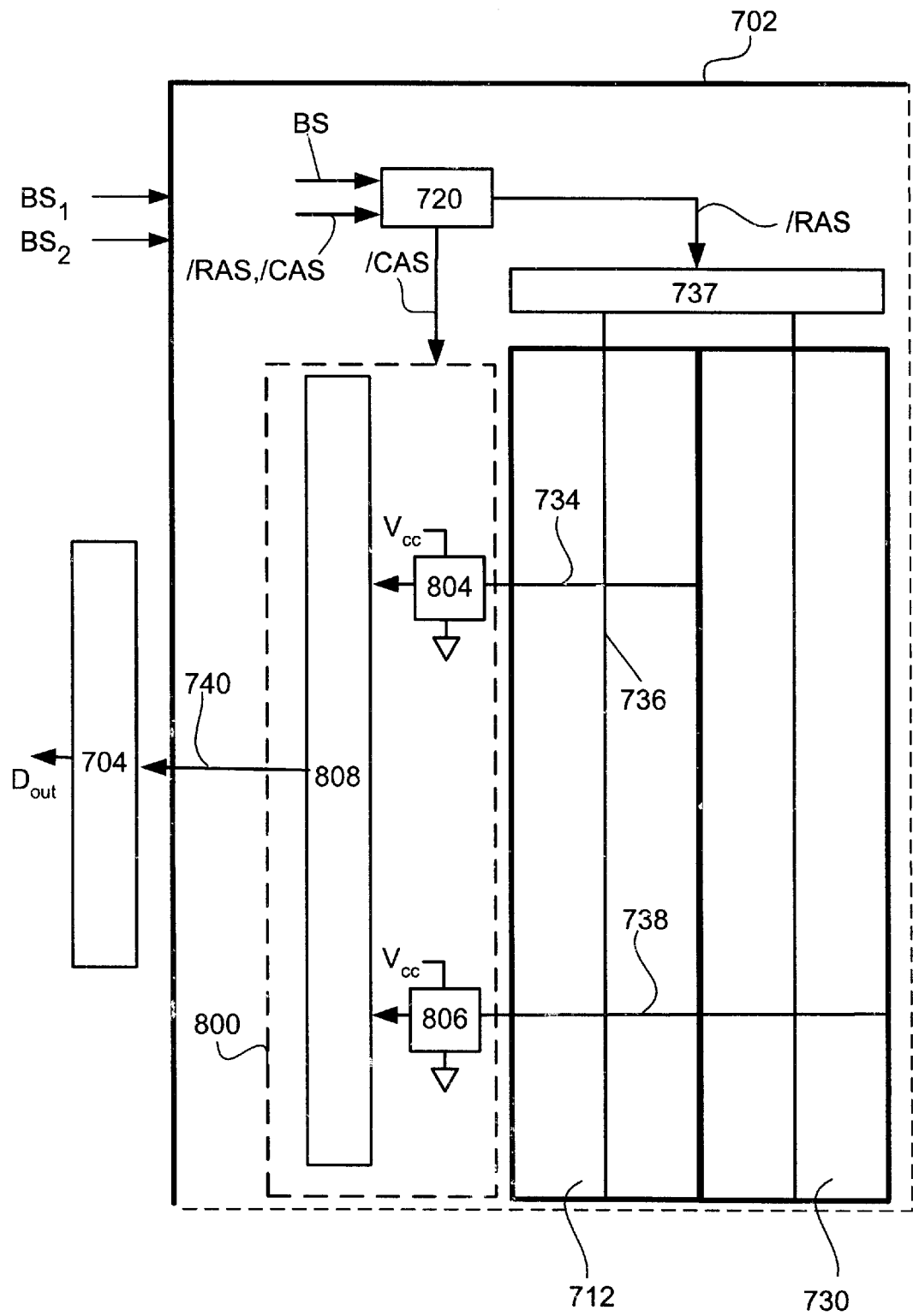
FIG. 7 illustrates a memory device having a segmented sense amp architecture in accordance with an embodiment of the invention.

FIG. 7 illustrates a segmented sense amp 800 in accordance with an embodiment of the invention. It should be noted, that the sense amp 800 is but one possible implementation of the sense amps 732, 742, 746, and 750 shown in FIG. 6 and is therefore not limiting the scope or intent of the invention. In the described embodiment, the segmented sense amp 800 includes a first sensing circuit 804 coupled to the bit line 734 arranged to detect any data stored on any memory cell located on a selected wordline, such as wordline 736 in response to a received bank select signal. For example, in the case where the bank select signal $BS_1$ is received by the multiplexer 720, decoding circuitry (not shown) enables the first sensing circuit 804 in preparation for sensing data on a selected wordline included in the bank segment 712.

If, however, the bank select signal is the bank select signal $BS_2$, then a second sensing circuit 806 coupled to the bit-line 738 is enabled in preparation for sensing data stored on a selected wordline included in the bank segment 730. By segmenting and distributing the sense amp functionality, the overall bit line sensing latency is reduced since the average bit line capacitance loading observed by the segmented sense amp 800 is substantially reduced over localized, non-distributed sense amps typical of conventional architectures. In some embodiments, a selector 808 is provided that directs the sensed data from the enabled sensing circuitry to the I/O 704 by way of the data line 740, be it the first or the second sensing circuits 804 or 806. This is typically accomplished by using the received bank select signal as, for example, an input to a multiplexer type switching circuit well known by those skilled in the art.

It should be realized that the inventive segmented sense amp architecture is applicable to multi-bank memory devices having any number of bank segments. Such multi-bank devices include, but are not limited to, SDRAMs, EDO DRAMs, SLDRAMs, and the like.

Figure 8:
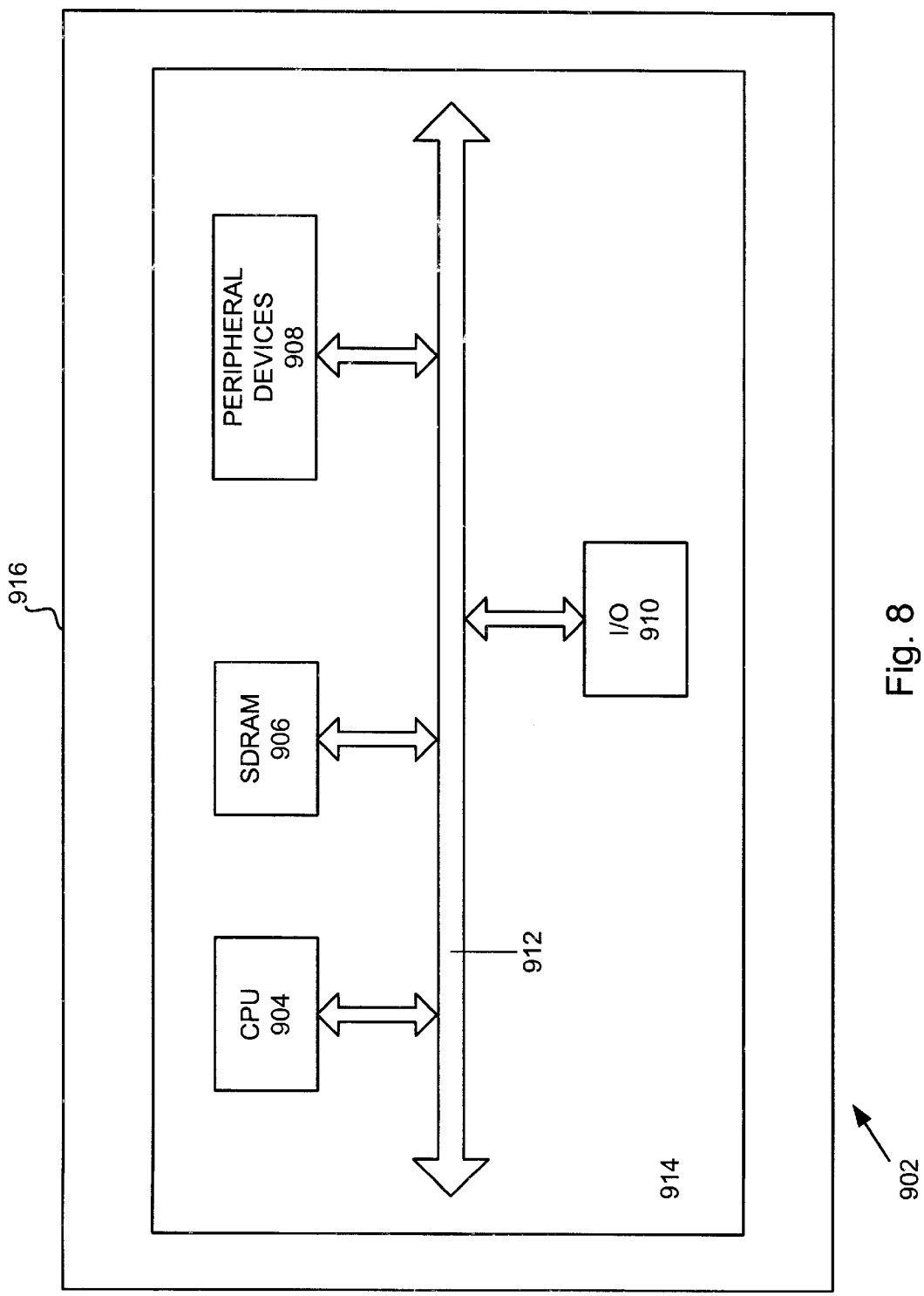
FIG. 8 illustrates a segmented sense amp in accordance with an embodiment of the invention.

FIG. 8 illustrates one general application of the SDRAM of the present invention as part of the data processing system 902. The data processing system 902 may include one or more of the following components: a processor 904; an SDRAM 906 as memory; I/O circuitry 908; and peripheral devices 810. These components are coupled together by a system bus 912 and are populated on a circuit board 914 that is contained in an end-user system 916.

The system 902 can be used in a wide variety of applications, such as computer networking, data networking, instrumentation, video processing, digital processing, or any other application where the advantage of using a high speed memory device is desirable. The SDRAM 906 can be used to perform a variety of different memory functions. For example, SDRAM 906 can be used to store executable instructions that works in cooperation with processor 904. The SDRAM 906 may also be used to store data used by the processor 904 in such applications as data processing, digital image manipulation programs, and the like in which fast access to a large amount of data is highly desirable. It should be noted that the system 902 is only exemplary, and that the true scope and spirit of the invention should be indicated by the following claims.

Although the foregoing invention has been described in some detail for purposes of clarity of understanding, it will be apparent that certain changes and modifications may be practiced within the scope of the appended claims.

Furthermore, it should be noted that there are alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A memory device, comprising:
   a plurality of input/outputs (I/Os); and
   a memory core having a plurality of memory cells coupled to the plurality of I/Os arranged to store data as at least a first data word and a second data word, wherein the memory core includes,
      a first bank segment arranged to store a first portion of the first data word,
      a second bank segment arranged to store a first portion of the second data word, wherein the first bank segment and the second bank segment are logically separate and distinct such that the first bank segment is activated only in response to a first bank select signal and wherein the second bank segment is activated only in response to a second bank select signal,
      a first segmented sense amp coupled to the first bank segment by way of a first bit line and to the second bank segment by way of a second bit line, wherein the first segmented sense amp responds to the first bank select signal by sensing the first portion of the data word using the first bit line and responds to a second bank select signal by sensing the first portion of the second data word using the second bit line such that a first bit line sensing delay associated with the first bit line is less than a second bit line sensing delay associated with the second bit line, and
      a first data line coupling the segmented sense amp to a nearest located one of the plurality of I/Os.

2. A memory device as recited in claim 1, wherein the first segmented sense amp includes:
   a first sensing circuit coupled to the first bit line responsive to the first bank select signal;
   a second sensing circuit coupled to the second bit line responsive to the second bank select signal; and
   a selector circuit coupled to the data line and to the first and the second sensing circuit, wherein the selector circuit couples the first sensing circuit to the proximally positioned one of the plurality of I/Os in response to the first bank select signal and wherein the selector circuit couples the second sensing circuit to the proximally positioned to a nearest one of the plurality of I/Os in response to the second bank select signal.

3. A memory device as recited in claim 2, wherein the memory cell is a synchronous dynamic random access memory cell (SDRAM).

4. A memory device as recited in claim 1, wherein the memory core further includes:
   a third bank segment arranged to store a second portion of the first data word logically coupled to the first bank segment so as to be responsive to the first bank select signal;

a fourth bank segment arranged to store a second portion of the second data word logically coupled to the second bank segment so as to be responsive to the second bank select signal;

a second segmented sense amp coupled to the third bank segment by way of a third bit line and to the fourth bank segment by way of a fourth bit line, wherein the third bit line is shorter than the fourth bit line, and wherein the second segmented sense amp responds to the first bank select signal by sensing the second portion of the data word using the third bit line and responds to a second bank select signal by sensing the second portion of the second data word using the fourth bit line such that a third bit line sensing delay associated with the third bit line is less than a fourth bit line sensing delay associated with the fourth bit line, and wherein the first and the third bit line sensing delays are substantially equal and wherein the second and fourth bit line sensing delays are substantially equal; and a second data line coupling the second segmented sense amp to a nearest located one of the plurality of I/Os.

5. A memory device as recited in claim 4, wherein the first and the third bank segments form a first virtual memory bank and wherein the second and fourth bank segments form a second virtual memory bank.

6. A memory device as recited in claim 5, wherein the second virtual memory bank and the first virtual memory bank are interleaved such that the second virtual memory bank is precharged when the first virtual memory bank is outputting the first portion and the second portions of the first data word.

7. A memory device as recited in claim 6, wherein when the first virtual memory bank has substantially completed outputting the first data word, the second virtual memory bank immediately begins to output the second data word.

8. A memory device as recited in claim 1, wherein the first bit line is shorter than the second bit line.

9. A method of accessing data by a requesting device from a memory device having a plurality of input/outputs (I/Os) and a memory core coupled to the plurality of I/Os arranged to store the data in the form of a data word, the memory core including a bank segment arranged to store a first portion of the data word and a second bank segment arranged to store a second portion of the data word wherein the first and the second bank segments are coupled to a segmented sense amp that is coupled to a first nearest one of the I/Os, wherein the segmented sense amp responds to a first bank select signal by using a first bit line to sense the first portion of the data word and responds to a second bank select signal using a second bit line to sense the second portion of the data word comprising:

providing the first bank select signal to the memory device;

enabling the segmented sense amp to sense the first portion of the data word in response to the first bank select signal;

enabling the segmented sense amp to sense the second portion of the data word in response to the second bank select signal; and sensing the first portion of the data word from a memory cell in the first bank segment such that a first bit line sensing delay is commensurably reduced.

10. A method as recited in claim 9, wherein the second bank segment is located at a central portion of the memory core so as to reduce power spiking during the activating.

11. A method as recited in claim 9, wherein the memory device is an SDRAM.

* * * * *